United States Patent
Yoon et al.

(10) Patent No.: US 7,595,136 B2
(45) Date of Patent: Sep. 29, 2009

(54) METHOD OF FABRICATING CHROME-LESS PHASE SHIFT MASK

(75) Inventors: Gi-Sung Yoon, Gyeonggi-do (KR); In-Kyun Shin, Gyeonggi-do (KR); Sung-Hyuck Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 521 days.

(21) Appl. No.: 11/325,149

(22) Filed: Jan. 3, 2006

(65) Prior Publication Data

US 2006/0147819 A1    Jul. 6, 2006

(30) Foreign Application Priority Data

Jan. 5, 2005    (KR) .................. 10-2005-0000994

(51) Int. Cl.
*G03F 1/00*    (2006.01)
(52) U.S. Cl. ................ 430/5; 430/394; 430/311
(58) Field of Classification Search ............. 430/5
See application file for complete search history.

(56) References Cited

U.S. PATENT DOCUMENTS

| 6,544,694 | B2 * | 4/2003 | Dirksen et al. ............ 430/5 |
| 2004/0202944 | A1 * | 10/2004 | Yang et al. ............... 430/5 |
| 2004/0219439 | A1 * | 11/2004 | Asano et al. .............. 430/5 |
| 2004/0248018 | A1 * | 12/2004 | Kang et al. ............... 430/5 |
| 2005/0058915 | A1 * | 3/2005 | Uematsu ................... 430/5 |

FOREIGN PATENT DOCUMENTS

| JP | 07-253649 | 10/1995 |
| KR | 2003-0056358 | 7/2003 |
| KR | 2004-0044502 | 5/2004 |

OTHER PUBLICATIONS

English language abstract of Japanese Publication No. 07-253649.
English language abstract of Korean Publication No. 2003-0056358.
English language abstract of Korean Publication No. 2004-0044502.

* cited by examiner

*Primary Examiner*—Mark F Huff
*Assistant Examiner*—Rashid Alam
(74) *Attorney, Agent, or Firm*—Marger Johnson & McCollom, P.C.

(57) ABSTRACT

An embodiment of a method of fabricating a chrome-less phase shift mask includes forming a hard mask film on a surface of a mask body having a trench circuit area and a mesa circuit area. The hard mask film is patterned. The mask body is anisotropically etched using the hard mask pattern as an etching mask to form pre-pitting patterns in the trench circuit area. The hard mask film having the hard mask pattern is again patterned to form a mesa hard mask pattern on the mesa circuit area and to expose a top surface of the trench circuit area. The mask body is anisotropically etched to form phase shift hillock patterns in the mesa circuit area and phase shift pitting patterns in the trench circuit area. Phase shift pitting patterns and phase shift hillock patterns may be formed on a single body.

21 Claims, 4 Drawing Sheets

METHOD OF FABRICATING CHROME-LESS PHASE SHIFT MASK

CROSS-REFERENCE TO RELATED APPLICATION

This application claims priority from Korean Patent Application No. 2005-00994, filed Jan. 5, 2005, the disclosure of which is hereby incorporated herein by reference in its entirety as is set forth fully herein.

BACKGROUND OF INVENTION

1. Technical Field

The present invention relates to a method of fabricating a photo mask, and more particularly, to a method of fabricating a chrome-less phase shift mask having no light-shielding film formed of chrome.

2. Discussion of the Related Art

Among processes for semiconductor fabrication, a photolithographic process of forming a fine circuit on a semiconductor substrate is critical. The productivity and quality of a semiconductor device depend on the process capability of the photolithographic process. In the photolithographic process, a photo mask is used to form a given circuit pattern on a semiconductor substrate. A chrome mask is an example of a photo mask. The chrome mask includes a mask body and a chrome light-shielding film. The mask body is formed of a transparent material, such as quartz. The chrome light-shielding film has a circuit pattern to be transferred. That is, the chrome mask has the chrome light-shielding film that in turn has the circuit pattern to be transferred, which is formed on a surface of the mask body. The chrome light-shielding film shields light irradiated in an exposure process so that the circuit pattern is formed in photoresist coated on the semiconductor substrate. However, the circuit pattern should be scaled down as much as possible to improve integration of the semiconductor device.

The chrome mask inherently has an error caused by light diffraction. That is, it is difficult to achieve a high accuracy of the circuit pattern with the chrome mask. Accordingly, the photo mask using the chrome light-shielding film has limitations in forming a fine-sized circuit pattern. Phase shift masks have been studied to solve this difficulty.

The phase shift mask is based on the diffraction and interference that occurs when transmitted light between adjacent patterns is mutually out of phase by 180°. Examples of the phase shift mask include a chrome-less phase shift mask, an attenuated phase shift mask, a phase-edge phase shift mask, and an alternating phase shift mask. Among them, the chrome-less phase shift mask allows a circuit pattern to be formed with phase shift patterns without the use of chrome.

The chrome-less phase shift mask comprises phase shift hillock patterns and phase shift pitting patterns. Both the phase shift hillock pattern and the phase shift pitting pattern transmit light. Light transmitted by the phase shift hillock pattern and the phase shift pitting pattern are mutually out of phase by 180°. Light sources having a mutual phase difference of 180° cause interference. With this interference, a predetermined pattern is formed on the photoresist. The given pattern formed by the interference may be adjusted using the phase shift hillock pattern and the phase shift pitting pattern. That is, an ideal arrangement of the phase shift hillock patterns and the phase shift pitting patterns allows the chrome-less phase shift mask to sophisticatedly form a finer pattern, compared to the chrome mask.

The chrome-less phase shift masks may be classified into a mesa scheme and a trench scheme, depending on their kinds of dark patterns. The mesa scheme implements the dark patterns by means of the phase shift hillock patterns while the trench scheme implements the dark patterns by means of the phase shift pitting patterns.

Semiconductor devices often include an area having a relatively wide circuit width and an area having a relatively narrow circuit width in a single chip. For example, the area having the wider circuit width may be a peripheral circuit area and the area having the narrower circuit width may be a cell area. In general, a light source used in an exposure device has a predetermined range of wavelengths. For this reason, a non-patternable region results depending on a dark-pattern implementing scheme. For example, in the mesa scheme, if the light source has a wavelength $\lambda$ of 193 nm, a region having an after develop inspection critical dimension (ADI CD) of less than 80 nm can be patterned. To form both a pattern having an ADI CD greater than 80 nm and a pattern having an ADI CD of 80 nm, a region having an ADI CD of 80 nm should be formed in the mesa scheme while a conventional chrome light-shielding film should be formed on the remaining region. Similarly, in the trench scheme, a region having an ADI CD less than 90 nm can be patterned. To form both a pattern having an ADI CD greater than 90 nm and a pattern having an ADI CD of 90 nm, a region having the ADI CD of 90 nm should be formed in the mesa scheme and a conventional chrome light-shielding film should be formed on the remaining region.

This limits the use of the chrome-less phase shift mask, complicates the fabrication process, and degrades patterning accuracy in a non-patternable region.

SUMMARY OF THE INVENTION

The present invention has been made to solve the aforementioned problems. The present invention is directed to provide a method of fabricating a chrome-less phase shift mask capable of expanding a patternable region.

In accordance with an exemplary embodiment, the present invention provides methods of fabricating a chrome-less phase shift mask. The methods may include forming a hard mask film on a surface of a mask body having a trench circuit area and a mesa circuit area. The hard mask film may be patterned to form a trench hard mask pattern on the trench circuit area. The mask body may be anisotropically etched using the trench hard mask pattern as an etching mask to form pre-pitting patterns in the trench circuit area. The hard mask film having the trench hard mask pattern may be patterned to form a mesa hard mask pattern on the mesa circuit area and to expose a top surface of the trench circuit area. The mask body may be anisotropically etched using the mesa hard mask pattern as an etching mask to form phase shift hillock patterns in the mesa circuit area and phase shift pitting patterns in the trench circuit area. Hillock portions between the phase shift pitting patterns may be formed below the top surfaces of the phase shift hillock patterns.

BRIEF DESCRIPTION OF THE DRAWINGS

The above and other characteristics and advantages of the present invention will become more apparent to those of ordinary skill in the art by describing in detail preferred embodiments thereof with reference to the attached drawings in which.

DETAILED DESCRIPTION OF THE INVENTION

Figure 1:
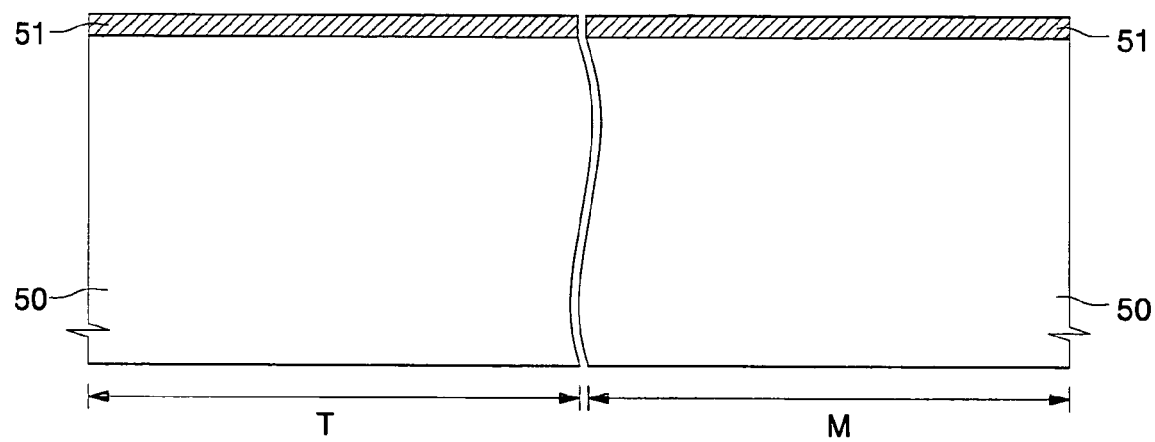
FIGS. 1 to 5 are cross-sectional views illustrating a method of fabricating a chrome-less phase shift mask according to an embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIGS. 1 to 5 are cross-sectional views illustrating a method of fabricating a chrome-less phase shift mask according to an embodiment of the present invention.

Referring to FIG. 1, a hard mask film 51 is formed on a surface of a mask body 50 having a trench circuit area T and a mesa circuit area M.

The mask body 50 may be formed of a material having high transmissivity and a uniform scattering characteristic with respect to light. For example, a thin quartz film of a rectangular shape is widely used as the mask body 50. Preferably, the hard mask film 51 is formed of a material film having an etching selectivity with respect to the mask body 50. The hard mask film 51 may be formed of for example a chrome (Cr) film. The chrome (Cr) film may be formed on the mask body 50 by using physical vapor deposition (PVD), such as metal evaporation or metal sputtering. Alternatively, the chrome (Cr) film may be formed using an electrochemical method, such as electroless plating. Preferably, the hard mask film 51 is formed to uniformly cover the entire surfaces of the trench circuit area T and the mesa circuit area M.

Figure 2:
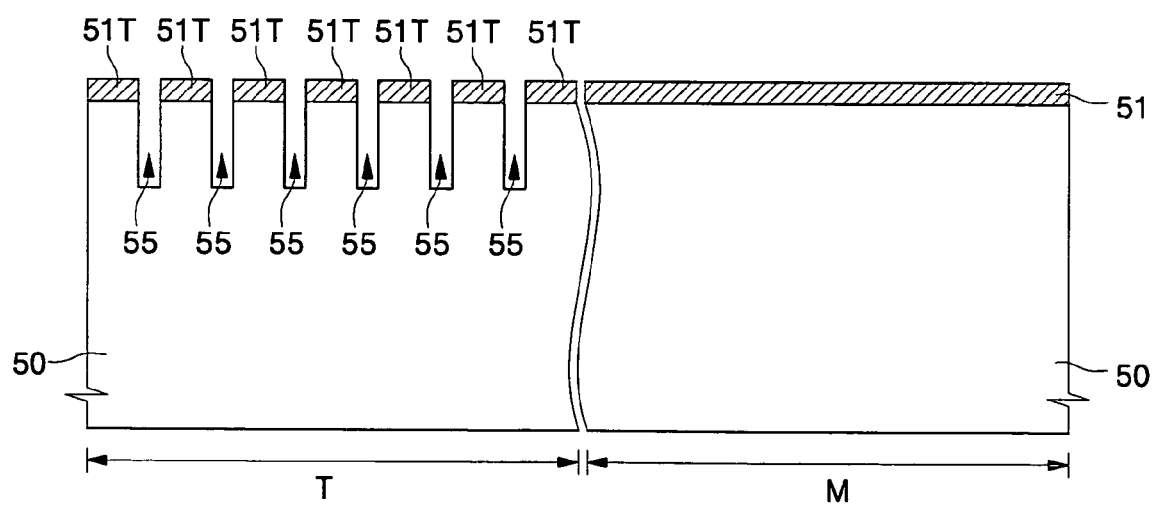

Referring to FIG. 2, the hard mask film 51 is patterned to form a trench hard mask pattern 51T in the trench circuit area T.

Patterning the hard mask film 51 may include forming a photoresist pattern (not shown) on the hard mask film 51, selectively etching the hard mask film 51 using the photoresist pattern as an etching mask to form the trench hard mask pattern 51T on the trench circuit area T, removing the photoresist pattern, measuring a critical dimension (CD) of the trench hard mask pattern 51T, examining defects of the trench hard mask pattern 51T, repairing the trench hard mask pattern 51T, and cleaning the mask body 50. As a result, the trench hard mask pattern 51T may be formed on the trench circuit area T, while the hard mask film 51 on the mesa circuit area M may remain.

Subsequently, the mask body 50 is anisotropically etched using the trench hard mask pattern 51T as an etching mask to form pre-pitting patterns 55 in the trench circuit area T.

Anisotropically etching the mask body 50 may be performed in a dry etching process in which plasma is used. For example, when the mask body 50 is formed of quartz, a silicon oxide etching gas may be used in the dry etching process. With the dry etching process in which the plasma is used, it is possible to easily adjust the direction and depth of the anisotropic etching and uniformly etch the mask body over a wide area of the mask body. As a result, the mask body 50 in the trench circuit area T may be partially recessed to result in the pre-pitting patterns 55 while the mesa circuit area M is protected by the hard mask film 51 where patterns are not to be formed. The depth of the pre-pitting patterns 55 may be adjusted by an etching condition, such as an etching time.

In addition, the anisotropic etching may be performed using one-time etching or multi-step etching. That is, the anisotropic etching may be carried out only one time to form the pre-pitting patterns 55, or repeatedly carried out two or more times to form the pre-pitting patterns 55. In the case where the multi-step etching is used to form the pre-pitting patterns 55, only a portion of the mask body 50 is anisotropically etched using the trench hard mask pattern 51T as an etching mask, after which contaminants on the mask body 50 and the trench hard mask pattern 51T are removed in a cleaning process, and finally a remaining portion of the mask body 50 is anisotropically etched once more using the trench hard mask pattern 51T as the etching mask, all of these processes being repeatedly performed one or more times. The multi-step etching may have improved contaminant removal and uniform pattern formation capabilities, compared to the one-time etching.

Figure 3:
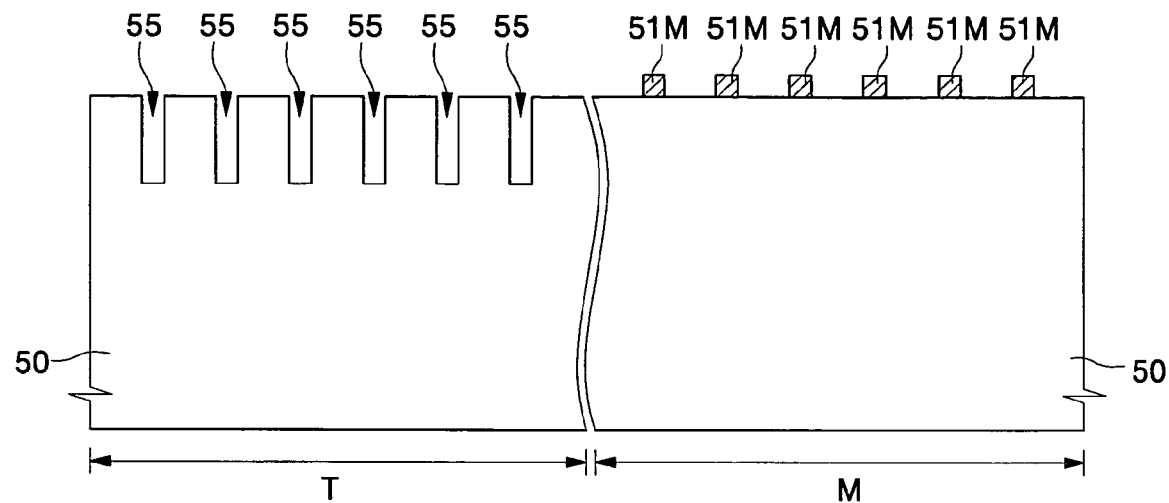

Referring to FIG. 3, the hard mask film 51 having the trench hard mask pattern 51T is patterned to form a mesa hard mask pattern 51M in the mesa circuit area M. Concurrently, the trench hard mask pattern 51T covering hillock portions between the pre-pitting patterns 55 is removed. That is, the top surface of the trench circuit area T is exposed.

The mesa hard mask pattern 51M may be formed by the same method as the trench hard mask pattern 51T illustrated in FIG. 2. That is, forming the mesa hard mask pattern 51M may include processes of forming a photoresist pattern (not shown) on the hard mask film 51 having the trench hard mask pattern 51T, selectively etching the hard mask film 51 using the photoresist pattern as an etching mask to form the mesa hard mask pattern 51M on the mesa circuit area M, removing the photoresist pattern, measuring a critical dimension (CD) of the mesa hard mask pattern 51M, examining defects of the mesa hard mask pattern 51M, repairing the mesa hard mask pattern 51M, and cleaning the mask body 50. The trench hard mask pattern 51T may be etched and removed together while the hard mask film 51 is being selectively etched to form the mesa hard mask pattern 51M.

Figure 4:
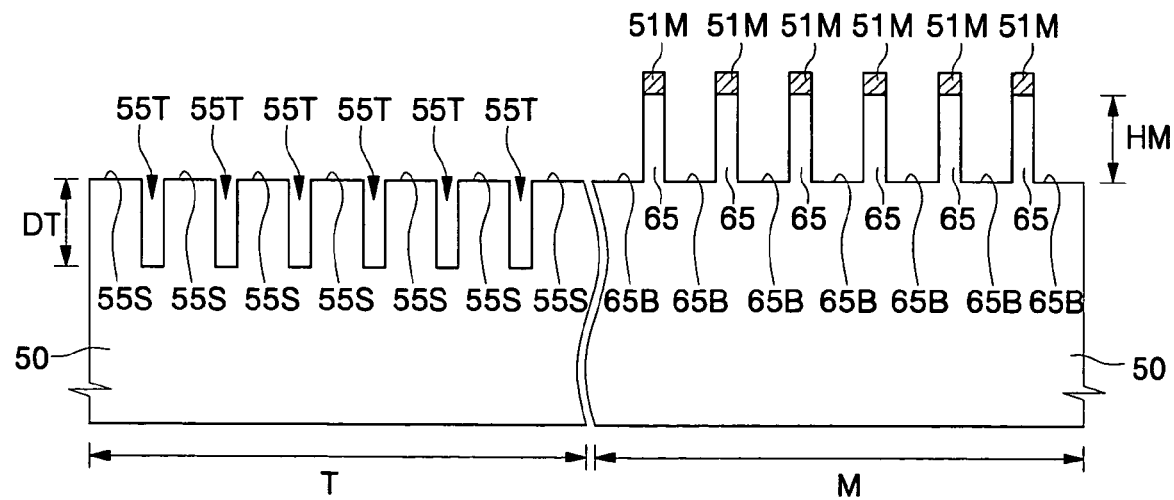

Referring to FIG. 4, the mask body 50 is anisotropically etched using the mesa hard mask pattern 51M as an etching mask to form phase shift hillock patterns 65 in the mesa circuit area M. Concurrently, phase shift pitting patterns 55T are formed in the trench circuit area T.

Specifically, anisotropically etching the mask body 50 may be performed by the same method as forming the pre-pitting patterns 55 illustrated in FIG. 2. That is, anisotropically etching the mask body 50 may be performed in a dry etching process in which plasma is used. For example, when the mask body 50 is formed of quartz, a silicon oxide etching gas may be used in the dry etching process. With the dry etching process in which the plasma is used, it is possible to easily adjust the direction and depth of the anisotropic etching and uniformly etch the mask body over a wide area of the mask body. As a result, the mask body 50 in the mesa circuit area M is partially recessed. A remaining portion of the mask body 50 in the mesa circuit area M becomes the phase shift hillock patterns 65. A hillock height HM of the phase shift hillock patterns 65 may be adjusted according to an etching condition, such as an etching time.

The exposed surfaces of the trench circuit area T are anisotropically etched and recessed together while the mask body 50 is anisotropically being etched to form the phase shift hillock patterns 65. That is, the pre-pitting patterns 55 in the trench circuit area T are recessed further, resulting in the phase shift pitting patterns 55T. The pitting depth DT of the phase shift pitting patterns 55T may be adjusted according to the depth of the pre-pitting patterns 55 and an etching condition of the dry etching process. Further, top surfaces 55S of hillock portions between the phase shift pitting patterns 55T may be formed below top surfaces of the phase shift hillock patterns 65. In the embodiment shown in FIG. 4, the top surfaces 55S of the hillock portions between the phase shift pitting patterns 55T may be formed to be coplanar with bottom surfaces 65B of the pitting regions between the phase shift hillock patterns 65 by controlling the anisotropic etching process.

In addition, the anisotropic etching may be performed using one-time etching or multi-step etching, as explained above. That is, the anisotropic etching may be carried out only one time to form the phase shift hillock patterns 65 and the phase shift pitting patterns 55T, or repeatedly carried out two or more times to form the phase shift hillock patterns 65 and the phase shift pitting patterns 55T. In the case where the multi-step etching is used to form the phase shift hillock patterns 65 and the phase shift pitting patterns 55T, only a portion of the mask body 50 is anisotropically etched using the mesa hard mask pattern 51M as an etching mask, after which contaminants on the mask body 50 and the mesa hard mask pattern 51M are removed in a cleaning process, and finally a remaining portion of the mask body 50 is anisotropically etched once more using the mesa hard mask pattern 51M as the etching mask, all of these processes being repeatedly performed one or more times.

Figure 5:
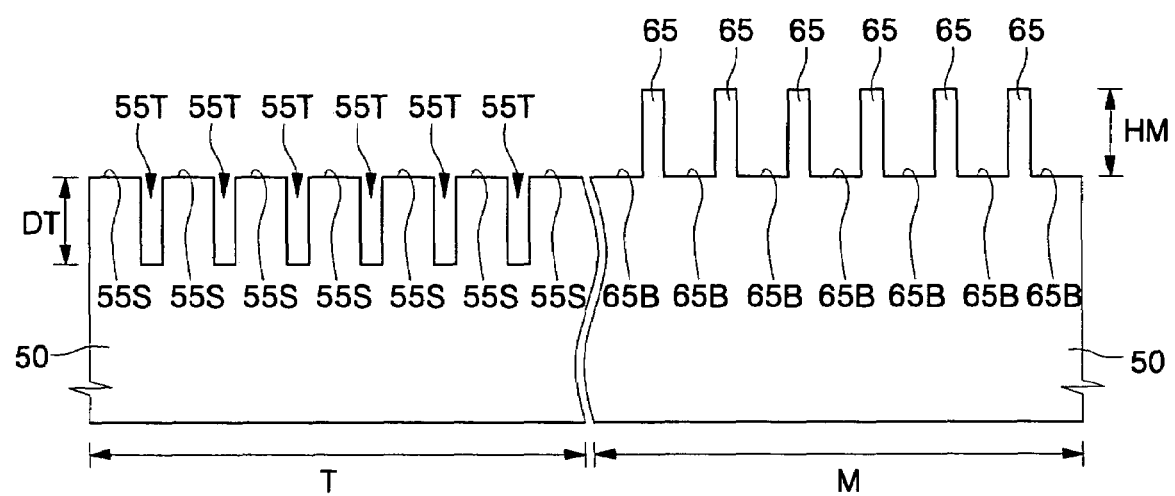

Referring to FIG. 5, the mesa hard mask pattern 51M is removed to expose the phase shift hillock patterns 65 in the mesa circuit area M.

The removal of the mesa hard mask pattern 51M may be performed by dry etching or wet etching. When the hard mask film 51 is formed of a chrome (Cr) film, wet etching may be performed using a metal film etching solution. The metal film etching solution may include at least one of an acid solution, such as sulphuric acid, nitric acid, hydrochloric acid, and the like.

The mask body 50 is then cleaned to complete a chrome-less phase shift mask having the phase shift hillock patterns 65 and the phase shift pitting patterns 55T.

Figure 6:
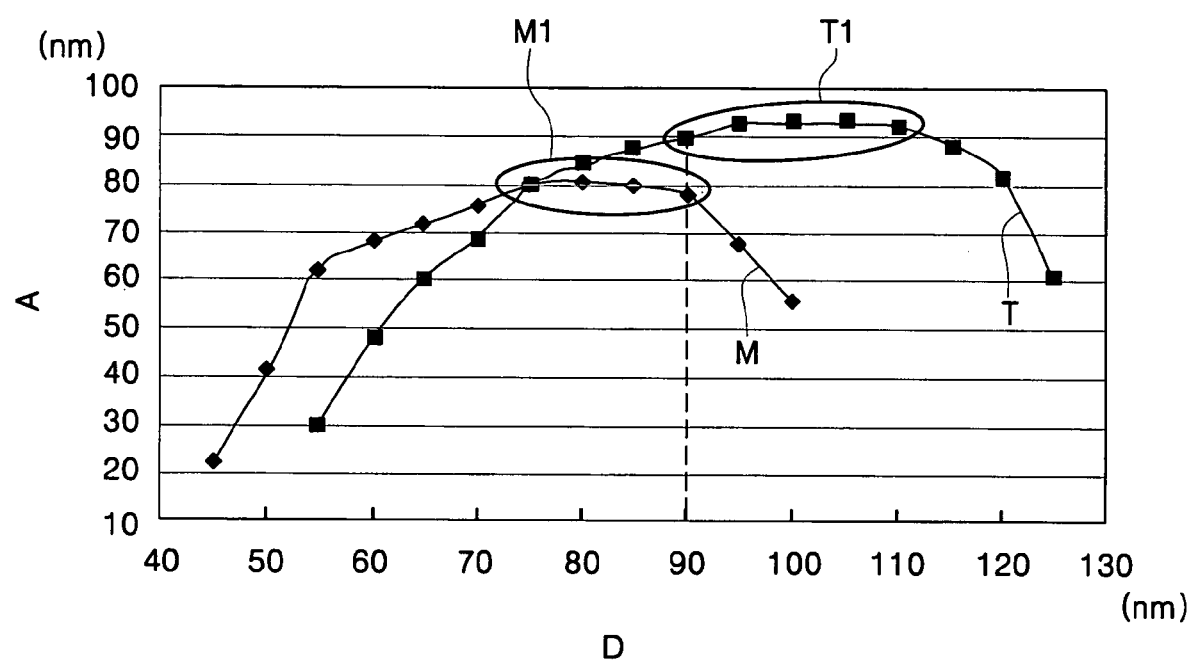
FIG. 6 is a graph showing simulation characteristics of a chrome-less phase shift mask according to an embodiment of the present invention.

FIG. 6 is a graph showing simulation characteristics of a chrome-less phase shift mask according to an embodiment of the present invention. In FIG. 6, the horizontal axis D indicates a design critical dimension (CD) in nanometer (nm) of the chrome-less phase shift mask, and the vertical axis A indicates an after develop inspection critical dimension (ADI CD) in nanometers (nm). Light for this simulation has a wavelength $\lambda$ of 193 nm.

Referring to FIG. 6, the curve M indicates a characteristic curve appearing when a phase shift hillock pattern is used as a dark pattern, and a curve T indicates a characteristic curve appearing when a phase shift pitting pattern is used as a dark pattern.

The chrome-less phase shift mask having the phase shift hillock patterns exhibits a simulation characteristic as shown in the curve M, with an increasing design CD. In a portion of the curve M in which the design CD ranges from 50 nm to 70 nm, the ADI CD sensitively increases with the increasing design CD. For example, when the design CD is 50 nm, the ADI CD is 40 nm, and when the design CD is 70 nm, the ADI CD is 75 nm. However, the chrome-less phase shift mask having the phase shift hillock patterns may have an error caused by process dispersion in the fabrication. As such, in the curve portion in which the ADI CD sensitively varies with the design CD, the mask is sensitive to the error caused by the process dispersion. That is, the portion in which the ADI CD sensitively varies with the design CD makes mass production difficult. In a portion M1 in which the design CD ranges from 70 nm to 90 nm, the increase in the design CD no longer leads to increase in the ADI CD. That is, even though the design CD increases from 70 nm to 90 nm, the ADI CD remains unchanged as 80 nm. In other words, the design CD may have a relatively wide portion M1 of 70 nm to 90 nm to obtain the ADI CD of 80 nm. As such, in the portion M1 in which the ADI CD remains unchanged even though the design CD increases, the mask is insensitive to the error caused by the process dispersion. In this case, in the portion M1 in which the ADI CD remains unchanged even though the design CD increases, process margin is very wide. That is, the portion M1, in which the ADI CD remains unchanged even though the design CD increases, is suitable for mass production. In a portion in which the design CD ranges from 90 nm to 100 nm, the ADI CD decreases with an increasing design CD. In a portion in which the ADI CD decreases with the increasing design CD, the ADI CD sensitively decreases with an increasing design CD. In the portion in which the ADI CD decreases with an increasing design CD, the mask is sensitive to the error caused by the process dispersion, making mass production difficult.

The chrome-less phase shift mask having the phase shift hillock patterns exhibits a simulation characteristic as shown in the curve T with an increasing design CD. In a portion of the curve T in which the design CD ranges from 60 nm to 80 nm, the ADI CD sensitively increases with an increasing design CD. For example, when the design CD is 60 nm, the ADI CD is 50 nm, and when the design CD is 80 nm, the ADI CD is 85 nm. However, the chrome-less phase shift mask having the phase shift pitting patterns may have an error caused by process dispersion in the fabrication. As such, in a portion in which the ADI CD sensitively varies with the design CD, the mask is sensitive to the error caused by the process dispersion. That is, the portion in which the ADI CD sensitively varies with the design CD makes mass production difficult. In a portion T1 in which the design CD ranges from 90 nm to 110 nm, the increase in the design CD no longer leads to increase in the ADI CD. That is, even though the design CD increases from 90 nm to 110 nm, the ADI CD remains unchanged as 90 nm. In other words, the design CD may have a relatively wide portion T1 of 90 nm to 110 nm to obtain the ADI CD of 90 nm. As such, in the portion M1 in which the ADI CD remains unchanged even though the design CD increases, the mask is insensitive to the error caused by the process dispersion. In the portion T1 in which the ADI CD remains unchanged even though the design CD increases, the process margin is very wide. That is, the portion T1, in which the ADI CD remains unchanged even though the design CD increases, is suitable for mass production. In a portion in which the design CD ranges from 110 nm to 125 nm, the ADI CD decreases with an increasing design CD. In the portion in which the ADI CD decreases with an increasing design CD, the ADI CD sensitively decreases with the increasing design CD. In the portion in which the ADI CD decreases with the increasing design CD, the mask is sensitive to the error caused by the process dispersion, making mass production difficult.

In addition, the design CD of 90 nm is within the portion in which the process margin is wide in both the phase shift hillock pattern and the phase shift pitting pattern. In this case, even though both the phase shift hillock pattern and the phase shift pitting patterns are formed with the design CD of 90 nm, ADI CDs differ from each other. When the phase shift hillock pattern has the design CD of 90 nm, the ADI CD is 80 nm, and when the phase shift pitting pattern has the design CD of 90 nm, the ADI CD is 90 nm. That is, to fabricate a semiconductor device having both the ADI CD of 80 nm and the ADI CD of 90 nm, both the phase shift hillock pattern and the phase shift pitting pattern may be formed with the design CD of 90 nm.

Referring back to FIGS. 5 and 6, the phase shift pitting patterns 55T and hillock portions between the phase shift pitting patterns 55T are formed in the trench circuit area T. The phase shift hillock patterns 65 and the pitting regions between the phase shift hillock patterns 65 are formed in the mesa circuit area M. That is, according to an embodiment of the present invention, it is possible to form a chrome-less phase shift mask having both the phase shift pitting patterns 55T and the phase shift hillock patterns 65 on the mask body 50. This enables a combination of the portion M1 in which the phase shift hillock patterns 65 have a relatively wider process margin with the portion T1 in which the phase shift pitting patterns 55T have a relatively wider process margin to fabricate a chrome-less phase shift mask. For example, the phase shift hillock patterns 65 may be formed in a circuit region requiring the ADI CD of 80 nm and the phase shift pitting patterns 55T may be formed in a circuit region requiring the ADI CD of 90 nm.

An exposure device used in a photolithographic process typically includes a light source for irradiating light having a predetermined wavelength, a mask mounting device with a photo mask mounted, and a focus lens disposed on an extension of the light source and the mask mounting device.

Preferably, the phase shift pitting patterns 55T and the hillock portions between the phase shift pitting patterns 55T are formed using adjustment of the pitting depth DT and pitch that light transmitting the phase shift pitting patterns 55T and light transmitting the hillock portions between the phase shift pitting patterns 55T are out of phase by 180°. The pitting depth DT and pitch may be determined based on a wavelength $\lambda$ and a diffraction angle $\theta$ of the irradiated light from the exposure device.

Similarly, the phase shift hillock patterns 65 and the pitting regions between the phase shift hillock patterns 65 are preferably formed using an adjustment of the hillock height HM and pitch. The hillock height (HM) and the pitch may also be determined based on the wavelength $\lambda$ and the diffraction angle $\theta$ of the irradiated light from the exposure device.

The phase shift pitting patterns 55T and the phase shift hillock patterns 65 may be formed to have the same pitch. As shown in FIG. 6, different ADI CDs may be obtained even though the phase shift pitting patterns 55T and the phase shift hillock patterns 65 have the same pitch. That is, with the phase shift pitting patterns 55T and the phase shift hillock patterns 65 having the same pitch, patterns having a different size may be sophisticatedly formed.

In addition, the phase shift pitting patterns 55T may be formed to have a greater pitch than that of the phase shift hillock patterns 65. These patterns having a different size may be sophisticatedly formed by using the fact that the portion having the wide process margin of the phase shift pitting patterns 55T is different from the portion having the wide process margin of the phase shift hillock patterns 65.

As described above, according to the present invention, it is possible to form phase shift pitting patterns and phase shift hillock patterns on one mask body. The portion having a wide process margin of the phase shift pitting patterns 55T is different from the portion having a wide process margin of the phase shift hillock patterns 65. Accordingly, it is possible to fabricate a chrome-less phase shift mask having sophisticated patterns of a different size.

What is claimed is:

1. A method of fabricating a chrome-less phase shift mask, the method comprising:
    forming a hard mask film on a surface of a mask body having a trench circuit area and a mesa circuit area;
    patterning the hard mask film to form a trench hard mask pattern on the trench circuit area;
    forming pre-pitting patterns in the trench circuit area by anisotropically etching the mask body using the trench hard mask pattern as an etching mask;
    patterning the hard mask film having the trench hard mask pattern to form a mesa hard mask pattern on the mesa circuit area and exposing a top surface of the trench circuit area; and
    forming phase shift hillock patterns in the mesa circuit area and phase shift pitting patterns in the trench circuit area by anisotropically etching the mask body using the mesa hard mask pattern as an etching mask, wherein hillock portions between the phase shift pitting patterns are formed lower than the top surfaces of the phase shift hillock patterns.

2. The method according to claim 1, wherein the mask body is formed of quartz.

3. The method according to claim 1, wherein the hard mask film is formed of a material film having an etching selectivity with respect to the mask body.

4. The method according to claim 1, wherein the hard mask film is formed of a chrome (Cr) film.

5. The method according to claim 1, wherein the anisotropic etching is performed by a dry etching process in which plasma is used.

6. The method according to claim 1, wherein the forming the pre-pitting patterns in the trench circuit area is performed using multi-step etching.

7. The method according to claim 6, wherein the multi-step etching comprises:
    anisotropically etching only a portion of the mask body using the trench hard mask pattern as an etching mask; and
    removing contaminants on the mask body and the trench hard mask pattern by a cleaning process, the anisotropically etching and the removing being repeatedly performed one or more times.

8. The method according to claim 1, wherein the forming the phase shift hillock patterns in the mesa circuit area and phase shift pitting patterns in the trench circuit area is performed using multi-step etching.

9. The method according to claim 8, wherein the multi-step etching comprises:
    anisotropically etching only a portion of the mask body using the mesa hard mask pattern as an etching mask; and
    removing contaminants on the mask body and the mesa hard mask pattern in a cleaning process, the anisotropically etching and the removing being repeatedly performed one or more times.

10. The method according to claim 1, wherein the forming the phase shift hillock patterns is performed so that light transmitting the phase shift hillock patterns and light transmitting pitting regions between the phase shift hillock patterns are out of phase by 180°.

11. The method according to claim 1, wherein the forming the phase shift hillock patterns is performed so that light transmitting the phase shift pitting patterns and light transmitting the hillock portions between the phase shift pitting patterns are out of phase by 180°.

12. The method according to claim 1, wherein top surfaces of hillock portions between the phase shift pitting patterns and bottom surfaces of pitting portions between the phase shift hillock patterns are substantially coplanar.

13. The method according to claim 1, wherein the phase shift pitting patterns and the phase shift hillock patterns are formed to have the same pitch.

14. The method according to claim 1, wherein the phase shift pitting patterns are formed to have a greater pitch than that of the phase shift hillock patterns.

15. The method according to claim 1, wherein the phase shift pitting patterns and the phase shift hillock patterns are formed with a pitch determined by a wavelength $\lambda$ and a diffraction angle $\theta$ of irradiated light.

16. The method according to claim 1, wherein the phase shift pitting patterns and the phase shift hillock patterns are formed with a pitting depth and a hillock height, respectively, which are determined by a wavelength $\lambda$ and a diffraction angle $\theta$ of irradiated light.

17. The method according to claim 1, further comprising removing the mesa hard mask pattern and cleaning the mask body after forming the phase shift pitting patterns and the phase shift hillock patterns.

18. A chrome-less phase shift mask, comprising:
a mask body having a trench circuit area and a mesa circuit area;
phase shift hillock patterns in the mesa circuit area;
phase shift pitting patterns in the trench circuit area; and
hillock portions between the phase shift pitting patterns, wherein the hillock portions are lower than top surfaces of the phase shift hillock patterns.

19. The chrome-less phase shift mask according to claim 18, wherein light transmitting the phase shift hillock patterns and light transmitting pitting regions between the phase shift hillock patterns are out of phase by 180°.

20. The chrome-less phase shift mask according to claim 18, wherein light transmitting the phase shift pitting patterns and light transmitting the hillock portions are out of phase by 180°.

21. The chrome-less phase shift mask according to claim 18, wherein top surfaces of the hillock portions and bottom surfaces of pitting portions between the phase shift hillock patterns are substantially coplanar.

\* \* \* \* \*